United States Patent [19]

Kocsis et al.

[11] 3,836,998

[45] Sept. 17, 1974

[54] HIGH VOLTAGE BIPOLAR SEMICONDUCTOR DEVICE AND INTEGRATED CIRCUIT USING THE SAME AND METHOD

[75] Inventors: Joseph Kocsis, Mountain View; Bohumil Polata, Los Altos, both of Calif.

[73] Assignee: Signetics Corporation, Sunnyvale, Calif.

[22] Filed: June 21, 1973

[21] Appl. No.: 372,427

Related U.S. Application Data

[63] Continuation of Ser. No. 111,704, Feb. 1, 1971, abandoned, which is a continuation of Ser. No. 791,665, Jan. 16, 1969, abandoned.

[52] U.S. Cl. .................... 357/53, 307/303, 357/48, 357/49, 357/68

[51] Int. Cl. .................... H01l 19/00

[58] Field of Search .... 307/303; 317/235 D, 234 N, 317/235 AA

[56] References Cited

UNITED STATES PATENTS

| | | | |
|---|---|---|---|
| 3,463,977 | 8/1969 | Grove et al. | 317/235 |
| 3,529,217 | 9/1970 | Van Santen | 317/235 |
| 3,544,861 | 12/1970 | Kooi | 317/235 |

*Primary Examiner*—Rudolph V. Rolinec
*Assistant Examiner*—William D. Larkins
*Attorney, Agent, or Firm*—Flehr, Hohbach, Test, Albritton & Herbert

[57] ABSTRACT

Planar bipolar semiconductor device in which a substantial portion of the collector base junction is covered by an insulating layer and has a layer of metallization overlying a substantial portion of the collector region to cause the depletion layer to be moved into the bulk of the semiconductor body and to be spread over a large area whereby the electric field is greatly reduced to cause breakdown to take place within the semiconductor body rather than at the surface. In an integrated circuit, the bipolar device is isolated by the use of dielectric isolation.

16 Claims, 13 Drawing Figures

INVENTORS
Joseph Kocsis
Bohumil Polata
BY
Flehr, Hohbach, Test,
Albritton & Herbert
Attorneys INVENTORS
Joseph Kocsis
Bohumil Polata
BY Flehr, Hohbach, Test, Albritton & Herbert
Attorneys

PATENTED SEP 17 1974 3,836,998

SHEET 3 OF 4

INVENTORS
Joseph Kocsis
Bohumil Polata
BY Flehr, Hohbach, Test, Albritton & Herbert
Attorneys

PATENTED SEP 17 1974

3,836,998

SHEET 4 OF 4

INVENTORS
Joseph Kocsis
Bohumil Polata
BY Flehr, Hohbach, Test, Albritton & Herbert
Attorneys

HIGH VOLTAGE BIPOLAR SEMICONDUCTOR DEVICE AND INTEGRATED CIRCUIT USING THE SAME AND METHOD

This application is a continuation of Ser. No. 111,704 filed Feb. 1, 1971 which in turn is a continuation of Ser. No. 791,665 filed Jan. 16, 1969 both now abandoned.

BACKGROUND OF THE INVENTION

Relatively high voltage semiconductor devices have heretofore been produced. However, generally such devices have been of the discrete type and, in addition, they have utilized a mesa type construction. In integrated circuits which typically use a planar construction, it has been very difficult to obtain devices which can withstand more than 50 volts. Generally, this has been true because in order to diffuse in selected areas in a planar construction, a thin oxide layer must be present at the surface of the silicon slice. Positive charges in this oxide, created by traces of sodium, attract electrons to the surface of the slice. In order to achieve a large breakdown voltage, the concentration of carriers must be very low (i.e., high resistivity), so that the carrier-free region created by the applied voltage (the depletion layer) has sufficient thickness to keep the electric field below the critical value for silicon (approximately 30 volts per micron). With positive charges in the surface oxide and high resistivity silicon, the carrier concentration near the surface can be many times that of the bulk silicon. The depletion layer, therefore, narrows as the field increases and the devices break down at a voltage much below the intended value. Even if the charges in the oxide layer could be removed, the small radius of the diffused base junction (about 2 microns) would concentrate the field around it (similar to the corona effect) and thus result in premature breakdown. There is, therefore, a great need for a semiconductor structure and method which will make possible the construction of high voltage semiconductor devices and, in particular, bipolar transistors and diodes and integrated circuits utilizing the same.

SUMMARY OF THE INVENTION AND OBJECTS

The bipolar semiconductor device consists of a semiconductor body having a planar surface. A first region of a first conductivity type is formed in the body. A second region of a second conductivity type is formed in the body within the first region so that a first PN junction is formed which extends to the surface. In a transistor, a third region of said first conductivity type is formed in said body within said second region and forms a second PN junction which extends to the surface. A layer of insulating material is disposed on said planar surface and generally covers said first and second PN junctions. Contact elements extend through said layer of insulating material and make contact with at least certain of said regions. Metallization is disposed on said layer of insulating material and covers at least a portion of the region extending beyond the first PN junction. This metallization may be called a field plate. The field plate pushes electrons away from the surface and causes the depletion layer to be moved into the bulk of the semiconductor body and to spread the depletion layer over a larger area in a plane generally parallel to the plane of the planar surface. When the bipolar device is incorporated in an integrated circuit, the bipolar device is isolated from the remainder of the circuit by dielectric isolation.

In general, it is an object of the present invention to provide a bipolar semiconductor device and integrated circuit incorporating the same and a method which makes possible the production of high voltage semiconductor devices.

Another object of the invention is to provide a bipolar semiconductor device and integrated circuit utilizing the same in which a layer of metallization is provided which serves as a field plate.

Another object of the invention is to provide a bipolar semiconductor device and integrated circuit incorporating the same in which the field plate and the contact elements can be formed as a single layer of metallization.

Another object of the invention is to provide a method of the above character in which the steps are compatible with the steps utilized in making conventional integrated circuits.

Another object of the invention is to provide a bipolar semiconductor device and an integrated circuit incorporating the same which can be utilized for various types of isolation including junction isolation and dielectric isolation.

Another object of the invention is to provide a bipolar semiconductor device and integrated circuit incorporating the same which can be utilized in an epitaxial construction.

Additional objects and features of the invention will appear from the following description in which the preferred embodiments are set forth in detail in conjunction with the accompanying drawings.

DESCRIPTION OF THE PREFERRED EMBODIMENTS

Figure 1:
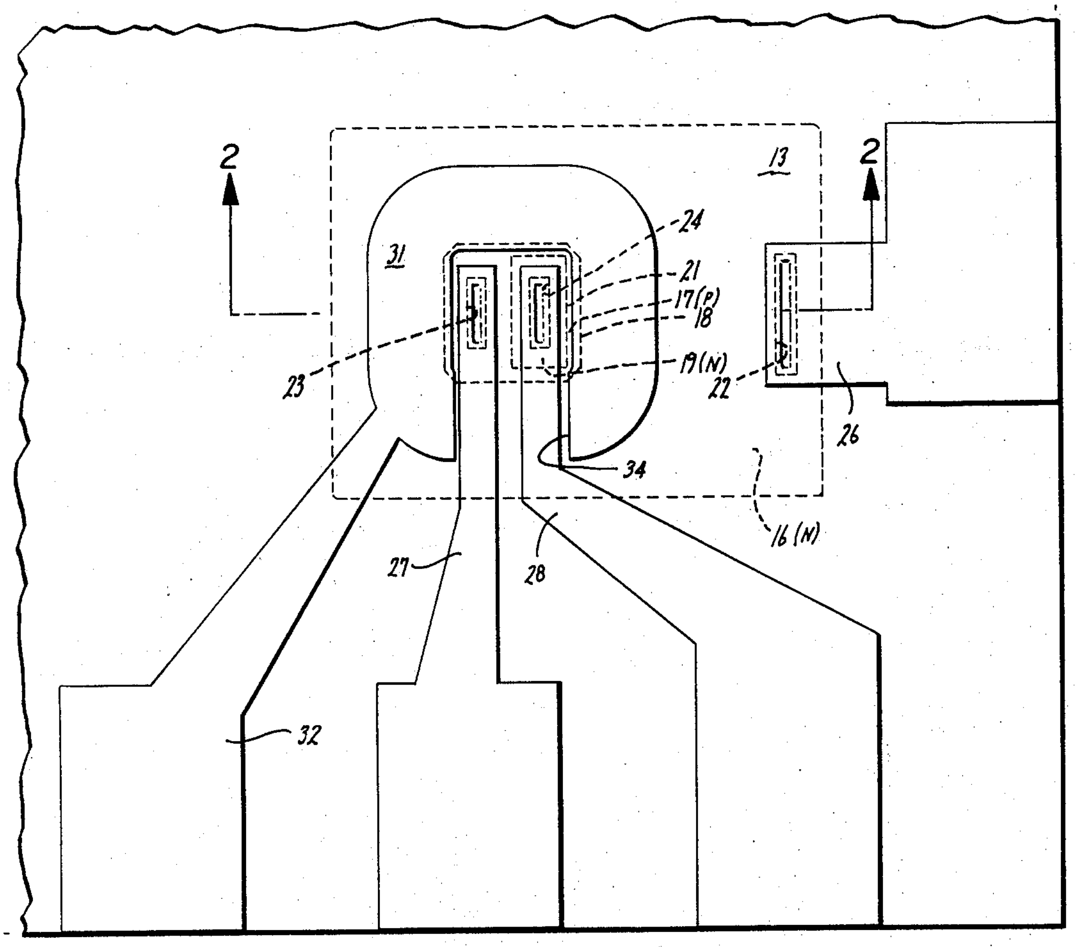
FIG. 1 is a top plan view of a bipolar semiconductor device, i.e., a transistor incorporating the present invention.
Figure 2:
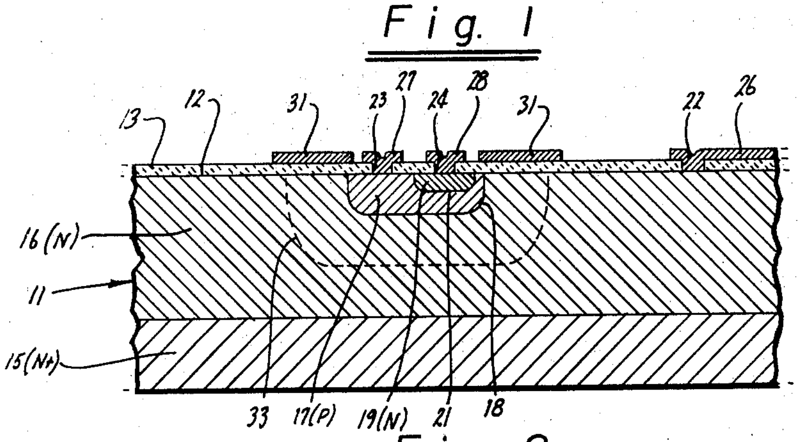
FIG. 2 is a cross-sectional view taken along the line 2—2 of FIG. 1.

In fabricating a bipolar transistor of the type shown in FIGS. 1 and 2, a semiconductor body 11 is utilized. The semiconductor body 11 preferably is of single crystal or monocrystalline silicon. The semiconductor body should have the desired resistivity and, in addition, should have a thickness which is great enough to provide the desired collector thickness to support the desired voltage. For example, if it is desired to construct a bipolar transistor which is capable of withstanding, for example 250 volts, silicon having a resistivity of 30 to 50 ohm cm. can be selected and having a thickness of approximately 40 to 60 microns. The semiconductor body 11 is provided with a planar surface 12. After the semiconductor body has been selected, the bipolar transistor is formed within the semiconductor body 11 in a substantially conventional manner to provide a bipolar transistor having planar geometry. Thus, typically, a layer 13 of suitable insulating material is formed over the planar surface 12.

A first region 16 of a first conductivity type is formed within the semiconductor body by diffusing the desired impurity of said one or first conductivity type through a window (not shown) open in the oxide layer 13. Alternatively, if desired, the semiconductor body can be provided with a suitable dopant so that the entire semiconductor body can serve as the first region or, typically, the collector region in a bipolar transistor. Typically, an N-type impurity could be diffused into the semiconductor body for the collector region. A highly doped layer 15 is formed at the bottom of the body 11 by diffusing an additional impurity of the same type as in the semiconductor body from the back or bottom side of the body.

Thereafter, a second region 17 of a second or opposite conductivity is formed within the first region 16. Typically, again, a P-type impurity can be diffused through an opening formed in the oxide layer 13 so that a first P-N junction 18 is formed which is generally dish-shaped in cross-section and which extends to the planar surface 12. In a bipolar transistor, the second region 17 forms the base and the P-N junction 18 is the collector-base junction. A third region 19 of the first conductivity type is formed within the second region to form a second P-N junction 21 which is also generally dish-shaped but offset within the first P-N junction and which also extends to the surface 12. This junction is typically called the base-emitter junction with the third region 19 serving as the emitter.

The steps thus far described are substantially conventional. After all the diffusion steps have been carried out, the oxide layer 13 can be stripped off and regrown. Thereafter, holes 22, 23 and 24 are formed in the oxide layer 13 for making contact to the first, second and third regions which serve as the collector, base and emitter, respectively, by the utilization of conventional masking and etching techniques. Thereafter, a suitable layer of metallization is applied over the insulating layer 13 and into the holes 22, 23 and 24 to make contact with the first, second and third regions. By suitable masking and etching techniques, the undesired portions of the metallization are removed so that there remains, as shown in FIG. 1, contact elements or leads 26, 27 and 28 which make contact to the first, second and third regions whereby said contact elements serve to make contact to the collector, base and emitter, respectively. It should be appreciated that for a single discrete device, the collector contact could be made to the bottom side of the body rather than the top side as shown, if desired.

In addition, there is provided a metal plate 31 which is formed by the metallization and which overlies the insulating layer 13. The plate 31, which can be called a field plate for reasons hereinafter described, has a geometry so that it generally overlies at least a substantial portion of the first region beyond the first P-N junction which is the collector-base junction in a bipolar transistor. The plate 31 is connected to a contact element 32 which is also formed from the metallization which previously had been applied.

The field plate 31 generally has a relatively precise geometry and can cover the base-collector junction and extend outwardly from the base-collector junction over a substantial portion of the collector region so that it will cover the depletion layer which is indicated by the broken line 33 in FIG. 2 that is formed during operation of the bipolar transistor. The depletion layer does not extend down to the N+ layer 15 so that the high voltage characteristic is retained. By way of example, in a bipolar transistor to operate at approximately 250 volts, it was found desirable that the field plate 31 extend inwardly beyond the collector-base junction 18 for a distance of 7½ microns and outwardly beyond the collector-base junction a distance of 35 microns to provide a field plate having a total width of 42½ microns.

In order to make possible the use of a single layer of metallization, the field plate 31 which generally circumscribes the emitter region 19 is broken at one side to provide a space 34 through which the contact elements 27 and 28 can extend to make contact to the base and emitter regions. It has been found that this does not noticeably affect the functioning of the field plate. Therefore, breaking of the field plate 31 is preferable or desirable in order to make possible a single layer of metallization for the field plate and all of the contact elements. However, it should be appreciated that, if desired, the field plate 31 can be formed as a separate and independent layer of metallization and when this is the case, it can be continuous so that it would overlie all of an annular portion of the collector region extending beyond the collector-base junction where the collector-base junction extends to the planar surface 12. An additional layer of insulating material could then be placed over the field plate and windows cut into the same to make contact to the base and emitter regions by a second layer of metallization formed on the layer of insulating material overlying the field plate.

Figure 3:
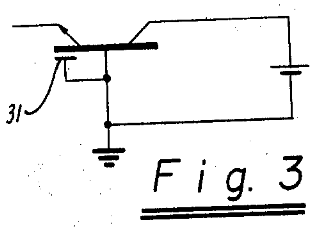
FIGS. 3, 4 and 5 are circuits illustrating the manner in which the field plate can be connected in a bipolar transistor of the type shown in FIGS. 1 and 2.
Figure 4:
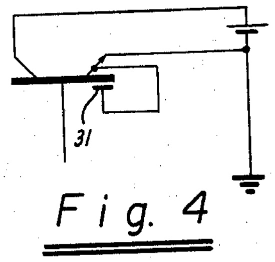
Figure 5:
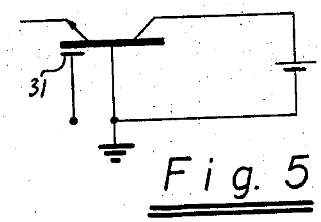

Operation of the bipolar transistor shown in FIGS. 1 and 2 in conjunction with the field plate may now be briefly described as follows. As shown in FIGS. 3, 4 and 5, the field plate which has been indicated schematically can be either connected to the base and the ground as shown in FIG. 3, or to the emitter and ground as shown in FIG. 4, or connected to a separate source of supply as shown in FIG. 5. With the N-P-N bipolar transistor hereinbefore described, both the emitter and the base are negative with respect to the collector and, therefore, with the connections shown in FIGS. 3 and 4, the field plate or metallic layer 31 would, in effect, be connected to a negative voltage so that positive oxide charges are neutralized. The depletion layer near the surface 12, therefore, is spread out over a much wider distance and the electric field is reduced. In other words, a sufficiently large negative voltage at the field plate pushes electrons away from the surface 12 and, therefore, the depletion layer is moved downwardly into the greater bulk of the semiconductor body 11 and is also spread out over a larger area when viewed in cross-section in a plane which is parallel to the plane of the surface 12. In this way, the electric field is greatly reduced and breakdown takes place inside the semiconductor body of the semiconductor device rather than at the surface 12. The field plate also eliminates the problem posed by the small base radius. As the depletion layer is extended sideways or outwardly, it passes smoothly over the edge of the base region.

From the foregoing, it can be seen that it is important that the field plate be sufficiently wide so that it extends over the depletion region. Since the depletion region increases in size with voltage, it is important that the size of the field plate be increased as the voltage requirements for the bipolar device increase. In general, the field plate causes the depletion layer to be wide near the surface which has the effect of reducing the field and to thereby decrease the possibility of breakdown at the surface. For good design practice, the field plate should be designed so that it has a width which is as wide as the depletion layer would be upon breakdown.

In the event that a plurality of bipolar transistors are constructed in a single semiconductor body, the bipolar transistors can have a common base configuration in which the field plates would be connected to the common base. FIG. 4 shows a common emitter configuration in which the field plate would be connected to the emitter. This would have the effect of reducing feedback from the field plate. When the field plate is connected to a common terminal which is basically a ground for high frequency, then the field plate will not have such a large deteriorating effect at high frequency. In FIG. 5, a common base configuration is shown in which the field plate can be independently biased. In such an embodiment, the field plate also can be grounded or different high frequency potentials can be supplied to the same so that, in effect, the device shown in FIG. 5 would act much like a tetrode and the field plate could be utilized to modulate the device.

Figure 6:
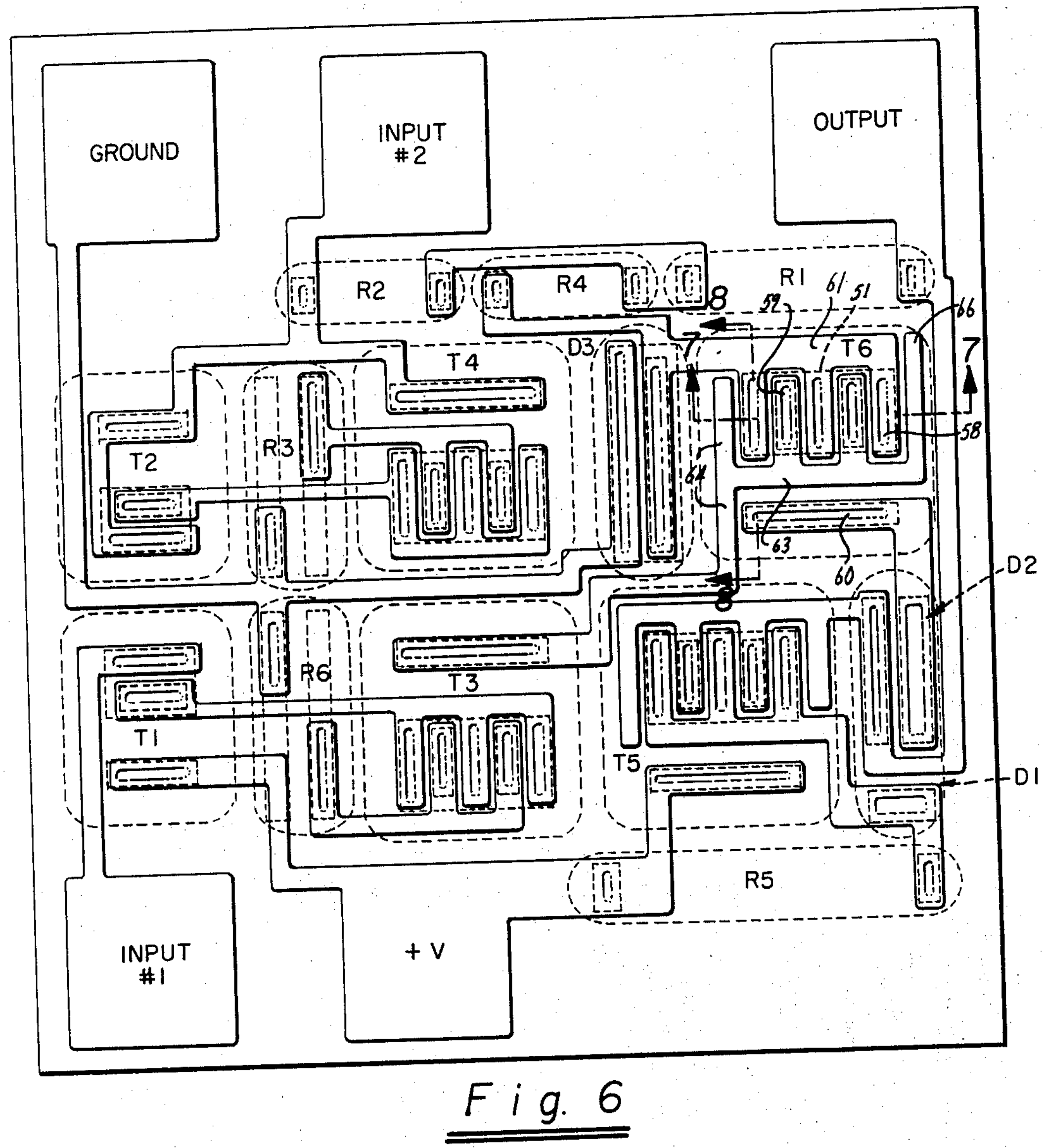
FIG. 6 is a top plan view of an integrated circuit incorporating the present invention.

An integrated circuit which includes high voltage bipolar transistors incorporating the present invention is shown in FIG. 6. When high voltage bipolar transistors are incorporated as a part of an integrated circuit, it is very desirable that such devices be isolated from the other parts of the circuit in some manner. For example, dielectric isolation can be utilized as hereinafter described or, alternatively, P-N junction isolation or air isolation can be utilized. In general, these various types of isolation are well known and one skilled in the art would have no difficulty in utilizing such different types of isolation in conjunction with the present invention.

Figure 8:
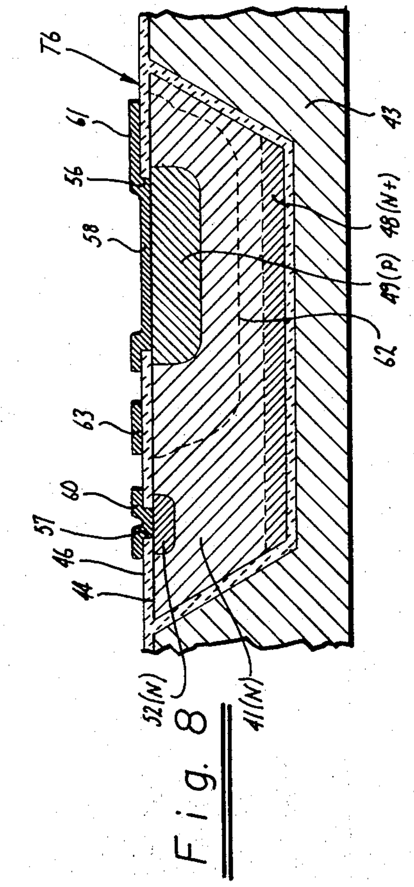
FIG. 8 is a cross-sectional view taken along the line 8—8 of FIG. 6.
Figure 7:
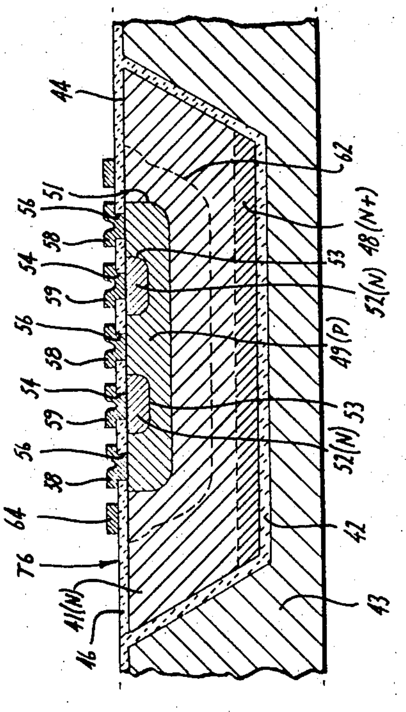
FIG. 7 is a cross-sectional view taken along the line 7—7 of FIG. 6.

The integrated circuit which is shown in FIG. 6 is a video amplifier which is described in copending application Ser. No. 791,661, filed Jan. 16, 1969. As described therein, the video amplifier includes transistors T-1, T-2, T-3, T-4, T-5 and T-6, as well as resistors R-1 through R-6 and diodes D-1, D-2 and D-3. The transistors T-1 through T-4 are low voltage transistors and do not utilize the field plate of the present invention. Transistors T-5 and T-6, however, are high voltage transistors and do utilize the field plate of the present invention. Cross-sectional views of the transistor T-6 are shown in FIGS. 7 and 8. As shown in FIGS. 7 and 8, dielectric isolation has been provided for the desired isolation. Dielectric isolation is provided in the manner disclosed in copending application Ser. No. 391,704, filed Aug. 24, 1964. The transistors and the diodes, with the exception of the field plate as hereinafter described, are formed in a substantially conventional manner. The resistors which form a part of the integrated circuit are formed in the manner described in copending application Ser. No. 791,660, filed Jan. 16, 1969.

In general, in forming a transistor such as shown in FIGS. 7 and 8, the island 41 is formed of a monocrystalline or single crystalline silicon which is etched with V-shaped grooves by the use of an anisotropic etch. The islands are then covered with a layer 42 of silicon dioxide which serves as an insulating layer and thereafter a polycrystalline layer 43 is provided for filling in the grooves and for providing a handle for the integrated circuit. Thereafter, the semiconductor body is turned upside down and is lapped until the silicon dioxide layers forming the grooves are exposed to form the islands 41 having a planar surface 44. A layer 46 of silicon dioxide is then formed on the surface 44 and joins with the layer 42 to completely surround the island. Thereafter, by conventional techniques, a first region 48 is formed within the island 41 by diffusing an impurity of one conductivity type through a window (not shown) cut in the oside layer 46. Typically, this could be an N-type impurity. It should be appreciated that in most situations, the N-type material is present in the starting substrate. Typically this first region would include an N+ buried layer, as shown, which would be diffused into the substrate or body before the isolation step commenced. Thereafter, a second region 49 is formed by diffusing an impurity of a second conductivity type, i.e., P-type, through another window (not shown) provided in the oxide layer 46 to form a first P-N junction 51 which is generally dish-shaped as shown and which extends to the planar surface 44. A pair of third regions 52 are then formed by diffusing through additional windows in the silicon dioxide layer 46 a third impurity which is generally of the same conductivity type, i.e., N-type, to form second dish-shaped P-N junctions 53 within the second region 49 and which also extend to the planar surface 44.

After these steps have been completed, the oxide layer 46 can be stripped and thereafter regrown if desired. A pair of openings 54 are formed in the oxide layer 46 overlying the emitter regions 52 and openings 56 can be provided in the layer 46 which overlie the base region 49.

An opening 57 (see FIG. 8) is also formed in the oxide layer to make contact to the collector region 48. As soon as the openings 54, 56 and 57 have been formed, a layer of metallization of a suitable material such as aluminum can be evaporated over the surface of the silicon dioxide layer 46 and into the openings 54, 56 and 57 to make contact with the collector, emitter and base regions of the transistor T-6 and also to make contact to the other portions of the integrated circuit as shown in FIG. 6. Suitable etching is thereafter performed to remove the undesired metallization so that there remains three base stripes 58 and two emitter stripes 59 and a collector stripe 60. As can be seen, the base and emitter stripes are interdigitated but are spaced from each other. The field plate in this high voltage transistor T-6 has been divided between the emitter and the base by the interdigitated metallization provided for the base and emitter stripes. Thus, there is provided a strip 61 which is integral with the base stripes 58 and which extends along one side of the transistor structure and extends from a line near the base-collector junction 51 over the collector region to a point which is beyond the depletion layer that is indicated by the generally dish-shaped dotted line 62 in FIGS. 7 and 8. Similarly, a strip 63 is formed integral with the emitter stripes 59 and extends along an opposite side of the transistor from a line near the base-collector junction to a point beyond the depletion layer 62. Fingers 64 and 66 are formed integral with the strip 63 at opposite ends thereof and extend across the two other opposite sides of the transistor structure and extend generally from a line near the base-collector junction 51 out beyond the point at which the depletion layer 62 extends. As is apparent from FIG. 6, the strips 61 and 63, together with the fingers 64 and 66, form a substantially continuous field plate which extends generally from the base-collector junction outwardly over the collector region to a point beyond which the depletion layer would extend for the voltage which is applied to the transistor. The construction of the field plate shown in FIG. 6, although not continuous because of the spacing between the various portions of the same, gives the effect of a continuous plate while being in fact separated into two portions between the interdigitated base and emitter stripes.

In general, the spacing between the various portions of the field plate should be sufficiently small so that the depletion layer will merge together beneath the various sections of the field plate to, in effect, provide a continuous depletion layer and to prevent an inversion occurring in the spaces provided between the sections of the field plate. Thus, as long as the open space between the metal portions which form the field plate is depleted, the spacing between the sections of the field plate should not affect the breakdown and the two sections of the field plate will have the same effect as if they were joined together.

It should be pointed out that the potential difference or the voltage difference between the emitter and the base of a typical transistor is only approximately 0.7 of a volt because the emitter and base are forward biased in operation. Therefore, when the field plate is separated between the base and emitter, they are separated by only 0.7 of a volt which would give the appearance insofar as the field plate is concerned that they are connected to the same voltage or, in other words, form a unipotential surface with respect to the collector so that, in effect, the depletion layer can readily bridge the space between the sections of the field plate. Thus, there should be no gaps in the depletion layer as long as the spacing between the sections of the field plate is no greater than twice the depth of the depletion layer. For example, if the depletion region had a depth of 8 microns, it would have a capability of bridging a gap of approximately 16 microns.

Although the field plate has been described as extending from near the base-collector junction over the collector region beyond the point to which the depletion layer would extend, it is not absolutely essential that the base-collector junction be covered. However, it is generally essential that the field plate should cover substantially all the depletion layer and particularly the outer extremities of the depletion layer, as for example, from a point at which normally breakdown might occur, i.e., 50 volts, to a point beyond the operating voltage intended as, for example, 250 volts. Thus, it is very important that the field plate cover the region through which the depletion layer would extend and would normally cause breakdown in a semiconductor device. However, in order to obtain the maximum protection against breakdown, it is desirable that substantially all portions of the depletion layer extending from the collector-base junction be covered. However, in certain situations, it might be desirable not to cover the junction because there is a possibility that there might be pin holes in the area overlying the junction which could cause a subsequent failure of the device.

Figure 9:
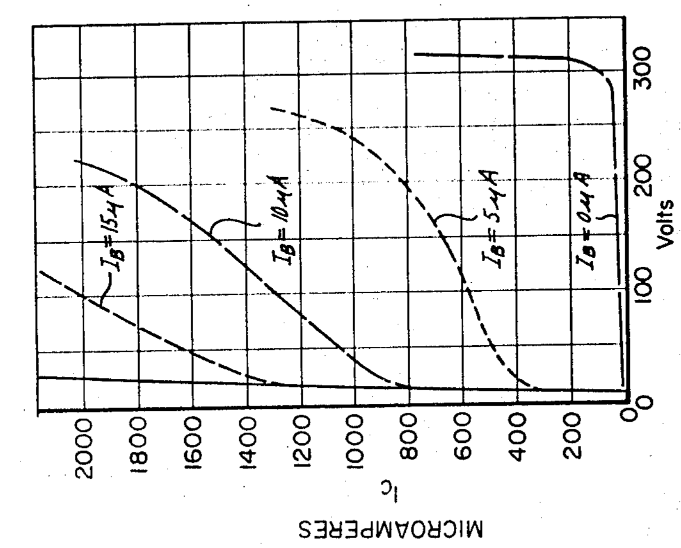
FIG. 9 is a graph showing the characteristics of a typical high voltage transistor incorporating the present invention.

The curve tracer characteristics of a dielectrically isolated 300 volt transistor made in accordance with the present invention is shown in FIG. 9. The display is of a common emitter configuration. The setting of the curve tracer was for 50 volts per division on the horizontal scale and 200 microamperes per division on the vertical scale with a base current of 5 microamperes per step. From the display shown in FIG. 9, it can be seen that the breakdown voltage between collector and emitter was approximately 320 volts. The current gain of the transistor was found to be approximately 120 which is generally considered to be good.

Figures 10, 11, 12, 13:
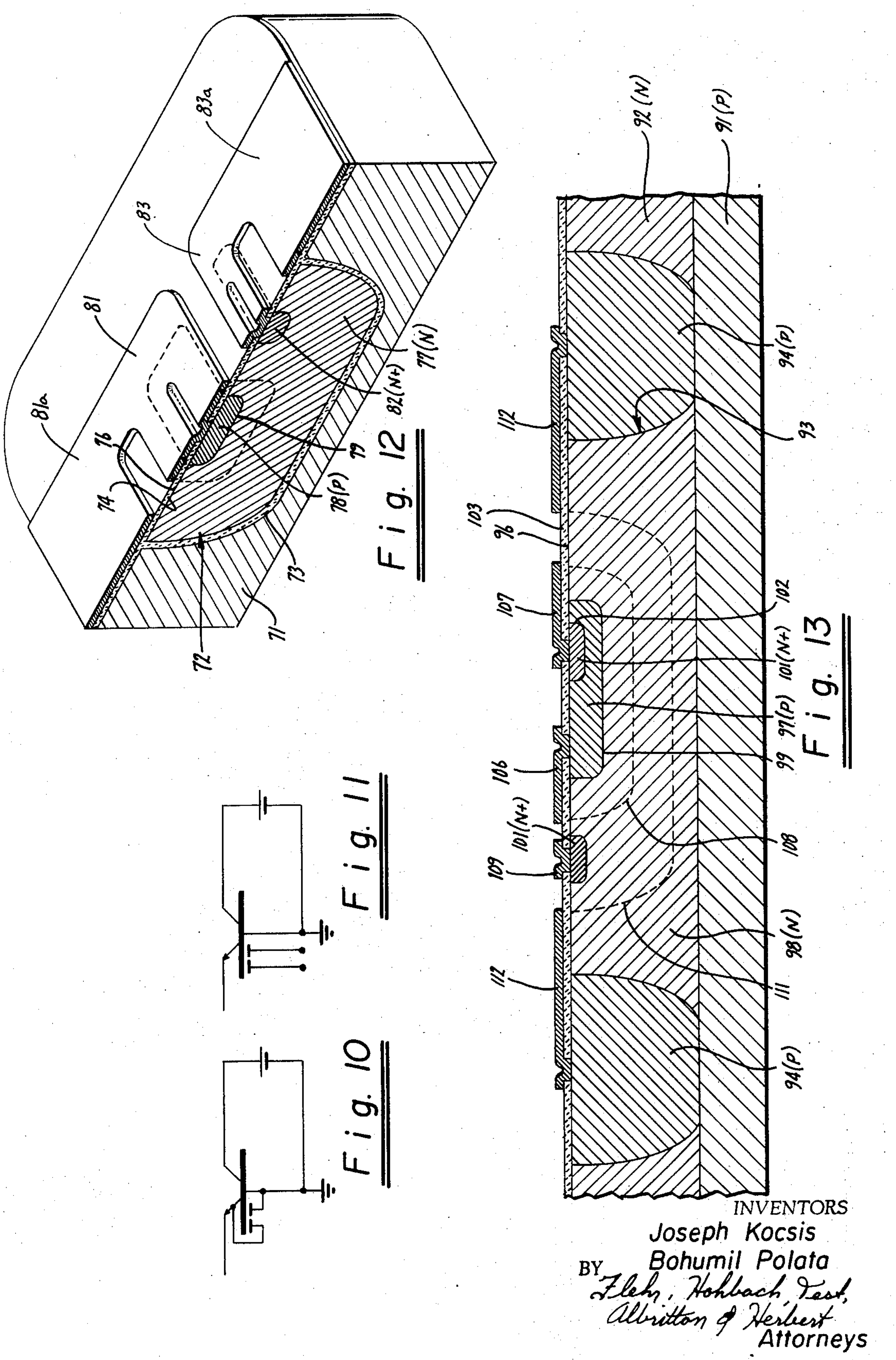
FIGS. 10 and 11 are circuits illustrating the manner in which split field plates can be connected in a bipolar transistor.
FIG. 12 is a cross-sectional view of a high voltage diode incorporating the present invention.
FIG. 13 is a cross-sectional view of a portion of the integrated circuit utilizing an epitaxial construction and incorporating the present invention.

FIG. 10 shows a common base configuration of a high voltage transistor in which the field plate has been split between the base and the emitter, i.e., one portion of the field plate is connected to the base and the other portion of the field plate is connected to the emitter.

In the configuration shown in FIG. 11, the field plates are independent and can be connected to different high frequency potentials. By utilizing the split high frequency field plate, it is possible to make a tetrode or pentode out of the transistor.

In FIG. 12 there is shown a cross-sectional view of a high voltage diode which is somewhat similar to the diodes D-1 and D-2 shown in FIG. 6 which is formed in substantially the same way as the high voltage transistor with the exception that the emitter diffusion is omitted. Thus, there is provided a semiconductor body 71 which has an island 72 dielectrically isolated therefrom by a dielectric isolating layer 73 formed of silicon dioxide. A layer 74 also is provided on the planar surface of the body 71. Thus, the island 72 can have an N-type impurity therein to provide a collector region 77. A base region 78 is diffused into the collector region and forms a dish-shaped collector-base junction 79 which extends to the surface 76. Metallization is provided on the silicon dioxide layer 74, portions of which have been etched away so that there remains a combined contact element and field plate 81 with a contact pad portion 81a. As can be seen from FIG. 12, the combined contact element and field plate 81 makes contact with the P-type base region 78. It also can be seen that the combined contact element and field plate is of a sufficient size so that it extends outwardly from the base region over the collector region so that the depletion layer which is represented by the broken line is covered by the field plate 81. An N+ region 82 is diffused into the collector region 77 to make good contact with the collector region and this N+ region is contacted by a contact element 83 which has a contact pad portion 83*a*. The operation of the diode in FIG. 12 is very similar to that of a transistor in that the field plate 81 has its breakdown between the collector and the base because the depletion layer again is covered by the metal plate and causes the depletion layer to be extended outwardly from the base region downwardly into the bulk of the device.

Although the diode has been shown as being dielectrically isolated, it should be appreciated that the same principles can be utilized in conjunction with discrete diodes and with diodes which are isolated by diffused regions.

In FIG. 13 there is shown an epitaxial semiconductor construction which also incorporates the present invention. As can be seen, the semiconductor body 91 has a layer 92 of N-type material epitaxially deposited thereon. The epitaxial layer 92 must be relatively thick because, as hereinafter described, allowance must be made for the depletion layer between the collector and the base of the transistor and also to provide room in the collector thickness for the depletion layer between the collector and the isolation means which, in this case, is formed by P-N junction isolation. Isolated islands 93 are formed by diffusing posts or regions 94 from the planar surface 96 downwardly until it meets the body 91 as shown in FIG. 13. In view of the fact that the epitaxial layer 92 is relatively deep, the posts 94 will be relatively wide because of the length of time required for the diffusion. Thereafter, an active device such as a transistor or a diode is formed in the island 93 in a conventional manner. Assuming that the epitaxial layer 92 has an N-type impurity, the base 97 can be diffused into the collector region 98 to form a P-N junction 99 which extends to the surface 96. Similarly, an N+ impurity is diffused into the base region 97 to provide an emitter region 101 which forms a dish-shaped P-N junction 102 that extends to the surface 96. Metallization is provided on the silicon dioxide insulating layer 103 formed on the surface 96 to provide a base contact element 106 which contacts the base region 97 and an emitter contact 107 that contacts the emitter region 101. Both the base contact 106 and the emitter contact 107 are formed in such a manner so that their outermost extremities extend over the collector region and beyond the depletion layer formed between the collector and the base and represented by the broken line 108. A collector contact element 109 is provided for making contact to the collector region 98. Therefore, it can be seen that the base field plate 106 in combination with the emitter field plate 107 serve to prevent breakdown between the collector and the base.

However, since there is also a voltage in high voltage devices which may be just as high or somewhat higher than between the collector and the base between the collector and the P-N junction formed between the substrate body 91 and the island 93, there is also a necessity for providing a field plate which will cover this depletion region which is represented in FIG. 13 by the area between the P-N junction and the broken line 111. The metallization hereinbefore described provides another field plate 112 which makes contact with the P-type region 94 as shown in FIG. 13 and then which extends inwardly over the collector region to a point which is beyond the depletion layer formed between the collector and the P-N junction used for isolation. It now can be seen that the epitaxial layer 92 must be constructed of such a thickness so that the two depletion regions, i.e., the base-collector depletion region and the collector-PN junction isolation, are sufficiently far apart so they do not come in contact with each other during normal operation of the semiconductor device.

Although only a single transistor has been shown in FIG. 13, it can be readily seen that an integrated circuit such as that shown in FIG. 6 can be constructed if desired. Also, it can be seen that, if desired, in place of junction isolation, dielectric isolation can also be utilized with an epitaxial layer.

From the foregoing, it can be seen that the field plate of the present invention can be utilized with many types of semiconductor devices to make possible the production of semiconductor devices which can be utilized with high voltages. In each of the embodiments, the depletion layer is moved into the bulk of the semiconductor device and is spread over a much larger area so that the electric field is greatly reduced and breakdown, if it occurs, must take place within the device rather than at the surface. The field plate also eliminates the problems posed by a small base radius because with the use of the field plate, the depletion layer is extended outwardly and passes smoothly over the edge of the base region.

It also can be seen from the foregoing that the steps utilized in the production of such high voltage devices are compatible with conventional steps in making planar type devices and in particular planar type integrated circuits. A single layer of metallization can be utilized for the leads and the field plate. Since the processing for the semiconductor device is very similar to that already being used, it is possible to produce high voltage discrete devices and integrated circuits with a very high yield and at low cost.

We claim:

1. In an active semiconductor device, a semiconductor body having a planar surface, a first region of a first conductivity type formed in the body, a second region of a second conductivity type formed in the body within the first region and forming a first P-N junction, at least a portion of which extends to the surface, a layer of insulating material disposed on said planar surface and generally covering said portion of the junction extending to the surface, contact elements extending through said insulating layer and making contact with at least one of said regions and metallic means serving as a field plate disposed on said insulating layer and covering a substantial portion of said first region, said metallic means being physically and electrically split in at least one point to provide a space therebetween, said metallic means being electrically isolated from said first region, and lead means carried by said insulating layer in contact with said metallic means and said contact elements, at least a portion of said lead means passing through said space.

2. A device as in claim 1 wherein said body has an epitaxial layer formed thereon and wherein said first and second regions are formed in said epitaxial layer.

3. A semiconductor device as in claim 1 together with a third region of said first conductivity type formed within said second region and forming a second P-N junction, at least a portion of which extends to the surface together with a contact element for making contact to said third region.

4. A semiconductor device as in claim 3 wherein said metallic means and said lead means lie in a single plane.

5. A semiconductor device as in claim 1 wherein said field plate is formed in at least two separate parts and wherein one of said parts is connected to one of said contact elements and the other of said parts is connected to another of said contact elements.

6. A semiconductor device as in claim 1 wherein said metallic means substantially surrounds the portion of said second region which lies on the planar surface of the semiconductor body.

7. A semiconductor device as in claim 1, together with means for biasing said device to produce a depletion region under said metallic means, and, wherein each space has a width which is less than twice the depth of the depletion layer.

8. In an integrated circuit, a semiconductor body having a planar surface, means carried by the body for forming a plurality of isolated islands on the body, a plurality of active and passive devices formed in said islands, at least one of said islands having a high voltage device formed therein, said high voltage active device comprising a first region of a first conductivity type formed in said one island, a second region of a second conductivity type formed in said island to provide a first P-N junction which extends to said planar surface, a layer of insulating material disposed on the planar surface of said body and over said junction, contact elements extending through said insulating layer and making contact with at least certain of said regions of said device, field plate means carried by said insulating layer and generally overlying a substantial portion of the first region, said field plate means with a voltage thereon serving to push the majority carriers away from the surface and to cause the depletion layer to be moved into the bulk of the semiconductor body, said field plate means being physically and electrically split in at least one point to provide a space therebetween, said field plate being electrically isolated from said first region and lead means carried by said layer of insulating material and making contact with said contact elements and said field plate means, at least a portion of said lead means passing through said space.

9. An integrated circuit as in claim 8 wherein a third region of said first conductivity type is formed in said island within said second region and forming a second P-N junction which extends to the surface and wherein said field plate means generally circumscribes said P-N junction at said surface.

10. An integrated circuit as in claim 8 wherein said isolation is formed by dielectric isolation.

11. An integrated circuit as in claim 8 wherein said isolation is formed by diffused junction isolation.

12. An integrated circuit as in claim 8 wherein said semiconductor body is provided with an epitaxial layer and wherein said active and passive devices are formed in said epitaxial layer.

13. An integrated circuit as in claim 8 wherein said isolation is formed by a P-N junction which extends downwardly from the surface through the epitaxial layer together with additional field plate means disposed on the insulating layer and generally covering a substantial portion of the first region and generally overlying the depletion layer which is formed between the first region and the P-N junction utilized for isolation.

14. An integrated circuit as in claim 8 wherein said high voltage active device is a diode.

15. An integrated circuit as in claim 8 wherein said high voltage active device is a transistor together with a third region of said first conductivity type disposed within said second region forming a second P-N junction, at least a portion of which extends to the surface together with an additional contact element for making contact with said third region.

16. An integrated circuit as in claim 8 wherein said field plate means is formed in at least two parts and wherein at least certain of said parts of said field plate means are formed integral with said lead means.

* * * * *